United States Patent
Dion et al.

(10) Patent No.: US 11,539,364 B2
(45) Date of Patent: Dec. 27, 2022

(54) ESTIMATION OF GAP BETWEEN A PROXIMITY SENSOR AND TARGET

(71) Applicant: Simmonds Precision Products, Inc., Vergennes, VT (US)

(72) Inventors: Bernard Dion, Monkton, VT (US); Eric DeWind, Burlington, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 451 days.

(21) Appl. No.: 16/428,331

(22) Filed: May 31, 2019

(65) Prior Publication Data

US 2020/0382119 A1 Dec. 3, 2020

(51) Int. Cl.
*H03K 17/95* (2006.01)

(52) U.S. Cl.
CPC ....... *H03K 17/952* (2013.01); *H03K 17/9502* (2013.01); *H03K 17/9505* (2013.01)

(58) Field of Classification Search
CPC .......... G01D 5/142; G01D 5/145; G01D 5/20; G01D 5/2006; H03K 17/952; H03K 17/9525; H03K 17/953; H03K 17/9532; H03K 17/9535; H03K 17/9502; H03K 17/9505; G01R 33/0023; G01R 33/0029; G01R 33/0035; G01R 33/007; G01R 33/0082; G01B 7/023; G01B 7/046; G01B 7/14
See application file for complete search history.

(56) References Cited

U.S. PATENT DOCUMENTS

| 5,446,379 | A | * | 8/1995 | Machi | G01N 27/82 324/240 |
| 6,570,377 | B1 | | 5/2003 | Demma et al. | |
| 7,173,410 | B1 | | 2/2007 | Pond | |
| 7,173,411 | B1 | | 2/2007 | Pond | |
| 2004/0027118 | A1 | | 2/2004 | Lenz et al. | |
| 2006/0171091 | A1 | * | 8/2006 | Seale | H02N 15/00 361/160 |
| 2020/0373923 | A1 | * | 11/2020 | Walsh | G01V 3/102 |

OTHER PUBLICATIONS

Extended European Search Report for European Patent Application No. EP19216232.9, dated May 28, 2020.
Bartoletti, C. et al: "The design of a proximity inductive sensor", Measurement Science and Technology, IOP, Bristol, GB, vol. 9, No. 8, Aug. 1, 1998, pp. 1180-1190, XP020064546, ISSN: 0957-0233, DOI: 10.1088/0957-0233/9/8/007.

* cited by examiner

*Primary Examiner* — David M Schindler
(74) *Attorney, Agent, or Firm* — Locke Lord LLP; Scott D. Wofsy; Judy R. Naamat

(57) ABSTRACT

A method is provided for sensing proximity of a target. The method includes sensing inductance associated with a magnetic field, wherein the inductance is affected by the target when the target is proximate the magnetic field. The method further includes providing the sensed inductance for processing. The processing includes determining an inductance value from at least the sensed inductance and estimating a parameter of a gap between a location of sensing the inductance and the target as a function of the inductance value and application of a nonlinear model of a relationship between the gap and inductance.

17 Claims, 4 Drawing Sheets

ESTIMATION OF GAP BETWEEN A PROXIMITY SENSOR AND TARGET

BACKGROUND

1. Field of the Disclosure

The present disclosure relates to proximity sensing, and more particularly, to estimation of a gap from a sensor to a target.

2. Description of Related Art

Proximity sensing is used to determine the gap, which is the relative distance, between points on two bodies in motion or at rest. One type of proximity sensing system involves a sensor resident on one of the bodies and a target to be sensed resident on the other body. It is well established that the effective inductance of the sensor, when measured, varies with the gap between the sensor and its target. An inductance proximity sensing system measures the inductance of the proximity sensor, and uses the measured inductance to estimate the gap between the sensor and its target. A relationship between inductance and gap is thus developed and used to make this estimation.

Gap calculations made by existing proximity sensing systems compensate for certain factors using estimates of cable-induced inductance as well as estimates of temperature using sensor resistance measurements. However, existing proximity sensing systems estimates gap by using linear relations between cable length, measured sensor inductance. However, the linearity assumption used by existing proximity sensing systems holds only for a small range of sensor-target gap, outside of which substantial error is introduced into the gap estimate.

Additional error is introduced by existing proximity sensing by estimating the gap while considering sensor resistance as a function of gap to be constant.

While conventional methods and systems have generally been considered satisfactory for their intended purpose, there is still a need in the art for a system and method that provides a gap estimating capability of the proximity sensing system that provides accuracy over a larger range of sensor-target gap than can be achieved when depending on linear relationships, that takes measures to avoid introducing substantial error, and is robust to noise.

SUMMARY

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, a system is provided for sensing proximity of a target. The system includes a sensor configured to generate a magnetic field and sense inductance, wherein the inductance is affected by the target when the target is proximate the sensor. The system further includes a sensor cable coupled to the sensor, the sensor cable being configured to provide the sensed inductance from the sensor to processing equipment. The processing equipment is configured to receive the sensed inductance via the sensor cable, determine an inductance value from at least the sensed inductance, and estimate a parameter of a gap between the sensor and the target as a function of the inductance value and application of a nonlinear model of a relationship between the parameter and inductance.

In another aspect, a method is provided for sensing proximity of a target. The method includes sensing inductance associated with a magnetic field, wherein the inductance is affected by the target when the target is proximate the magnetic field. The method further includes providing the sensed inductance for processing. The processing includes determining an inductance value from at least the sensed inductance and estimating a parameter of a gap between a location of sensing the inductance and the target as a function of the inductance values and application of a nonlinear model of a relationship between the parameter and inductance.

Further aspects of the disclosure include a method for sensing proximity of a target. The method includes receiving a signal associated with sensing inductance associated with a magnetic field, wherein the inductance is affected by the target when the target is proximate the magnetic field. The method further includes determining an inductance value from the signal and estimating a parameter of a gap between a location of sensing the inductance and the target as a function of the resistance and inductance values and application of a nonlinear model of a relationship between the parameter and inductance.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE EMBODIMENTS

Figure 1:
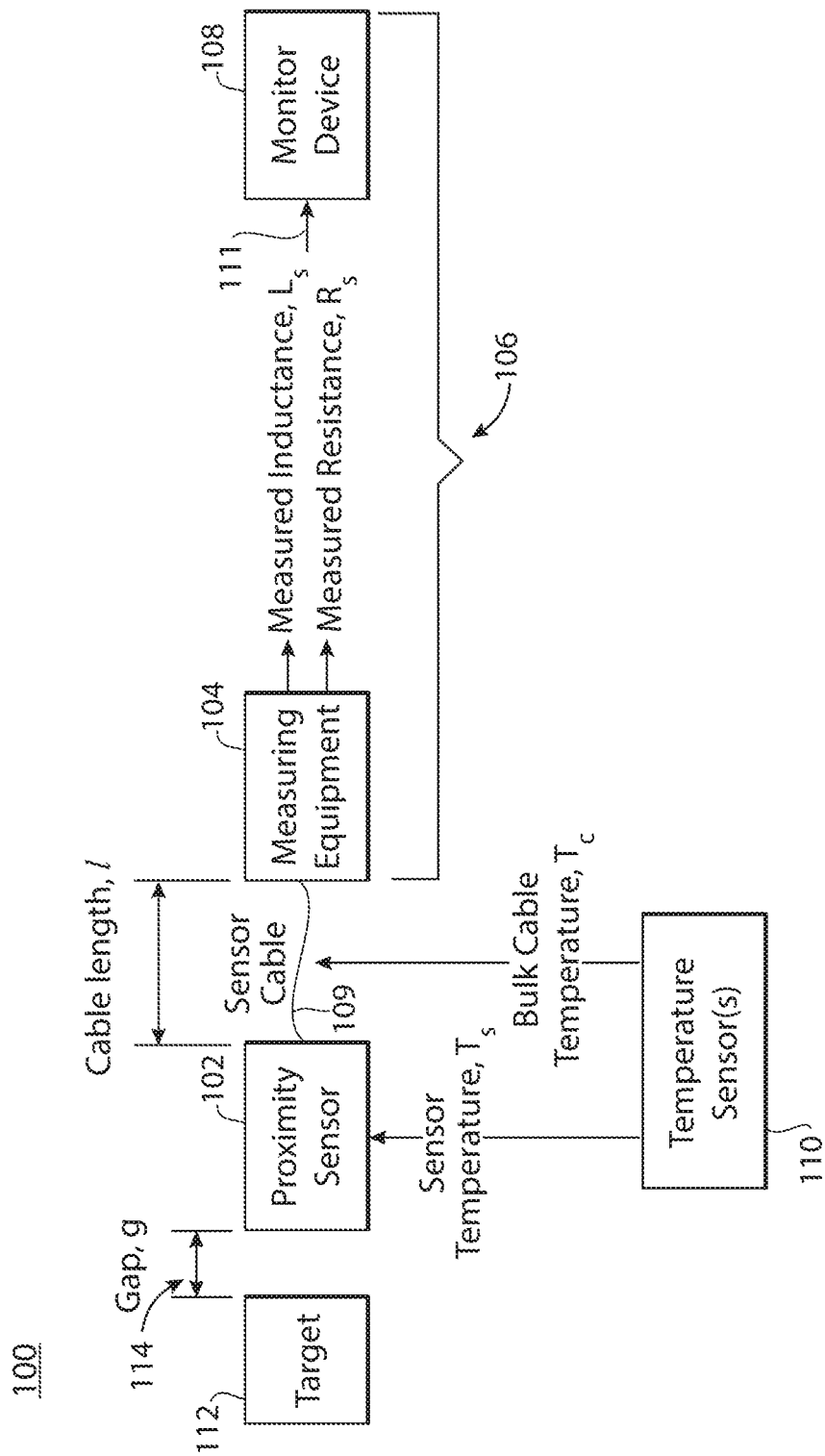
FIG. 1 is a block diagram fir a proximity sensor system in accordance with embodiments of the disclosure.

Reference will now be made to the drawings wherein like reference numerals identify similar structural features or aspects of the subject disclosure. For purposes of explanation and illustration, and not limitation, a block diagram of an exemplary embodiment of a proximity sensor system in accordance with the disclosure is shown in FIG. 1 and is designated generally by reference character 100. Other embodiments of the proximity sensor system 100 in accordance with the disclosure, or aspects thereof, are provided in FIGS. 2-4, as will be described.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, exemplary methods and materials are now described.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth. It is to be appreciated the embodiments of this disclosure as discussed below are implemented using a software algorithm, program, or code that can reside on a computer useable medium for enabling execution on a machine having a computer processor. The machine can include memory storage configured to provide output from execution of the computer algorithm or program.

As used herein, the term "software" is meant to be synonymous with any logic, code, or program that can be executed by a processor of a host computer, regardless of whether the implementation is in hardware, firmware or as a software computer product available on a memory storage device or for download from a remote machine. The embodiments described herein include such software to implement the equations, relationships, and algorithms described above. One skilled in the art will appreciate further features and advantages of the disclosure based on the above-described embodiments. Accordingly, the disclosure is not to be limited by what has been particularly shown and described, except as indicated by the appended claims.

FIG. 1 further shows the proximity sensor system 100 includes a sensor 102 and processing equipment 106, wherein the processing equipment 106 includes measuring equipment 104 and monitor device 108. The measuring equipment 106 is coupled to the sensor 102 by a sensor cable 109. Measuring equipment 104 can communicate with monitor device 108 via one or more communication links 111. Sensor 102 can be disposed on a surface (not shown) that can be located in proximity of a target 112. The target 112 is spaced from the sensor 102 by a gap (g) 114, wherein a parameter of the gap 114 (e.g., length of the gap that defines the distance between the sensor 102 and the target 112) is estimated by the sensor system 100.

The sensor 102 is an inductive proximity sensor in which an AC current flows in a coil (not shown) (also referred to as a loop, spool or winding) provided about a core, e.g., a metallic core (not shown), inducing a magnetic field that is affected when a target is in proximity. The AC current can be provided, for example, by an oscillator that receives a DC power signal from a power supply (not shown), without limitation to the particular example. Changes in proximity to a target that has a conductive or magnetically permeable material affects the coil's impedance and inductance.

Sensor cable 109 is coupled between sensor 102 and measuring equipment 104 to provide to measuring equipment 104 a signal associated with sensing (e.g., at the core or coil of sensor 102) inductance and/or resistance by the sensor 102. Sensor cable 109 can be a smart cable that stores parameters associated with sensor cable 109, such as length l of the sensor cable 109. Alternatively, length l of the sensor cable 109 can be manually entered into measuring equipment 104 or monitor device 108. In either scenario, length l of the sensor cable 109 only needs to be provided once, such as at a time of installation.

Measuring equipment 104 can include analog and/or digital devices that measure inductance and resistance indicated in the signal received from sensor 102. Measuring equipment 104 performs signal processing to extract and measure the inductance and resistance from the signal and output corresponding inductance and resistance values that represent inductance and resistance in sensor 102, respectfully.

Monitor device 108 can receive the inductance and resistance values and length l from the measuring equipment 104 via the one or more communication links 111. Communication link(s) 111 can include wired or wireless links. In certain applications, such as airborne and/or military applications, the communications links can be only wired links.

Figure 2:
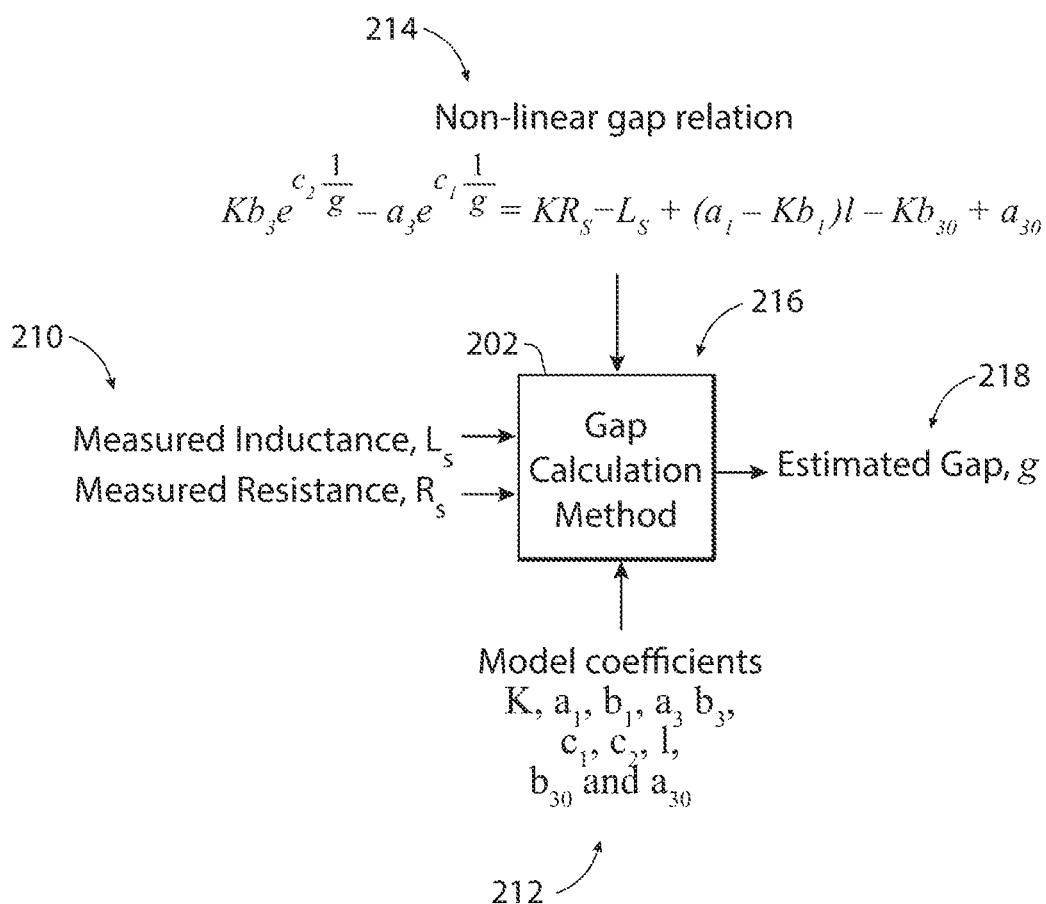
FIG. 2 is a flow diagram for estimating a parameter of a gap by the proximity sensor system while correcting inductance in accordance with embodiments of the disclosure.
Figure 3:
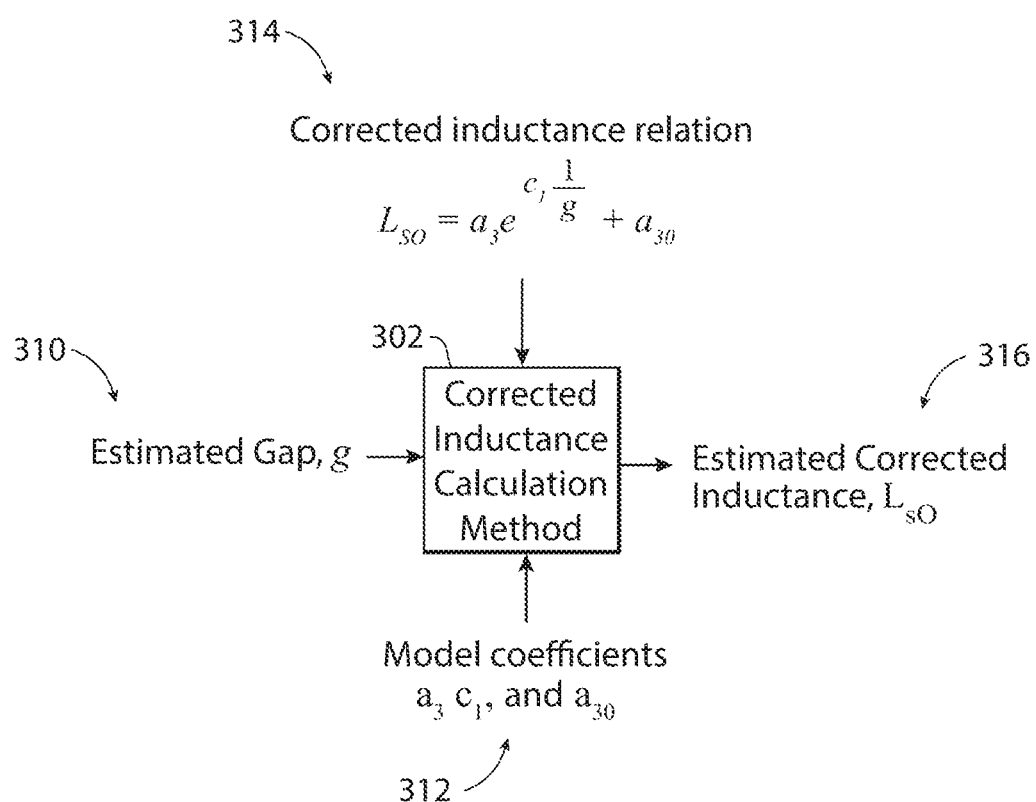
FIG. 3 is a flow diagram for estimating corrected inductance by the proximity sensor system in accordance with embodiments of the disclosure.
Figure 4:
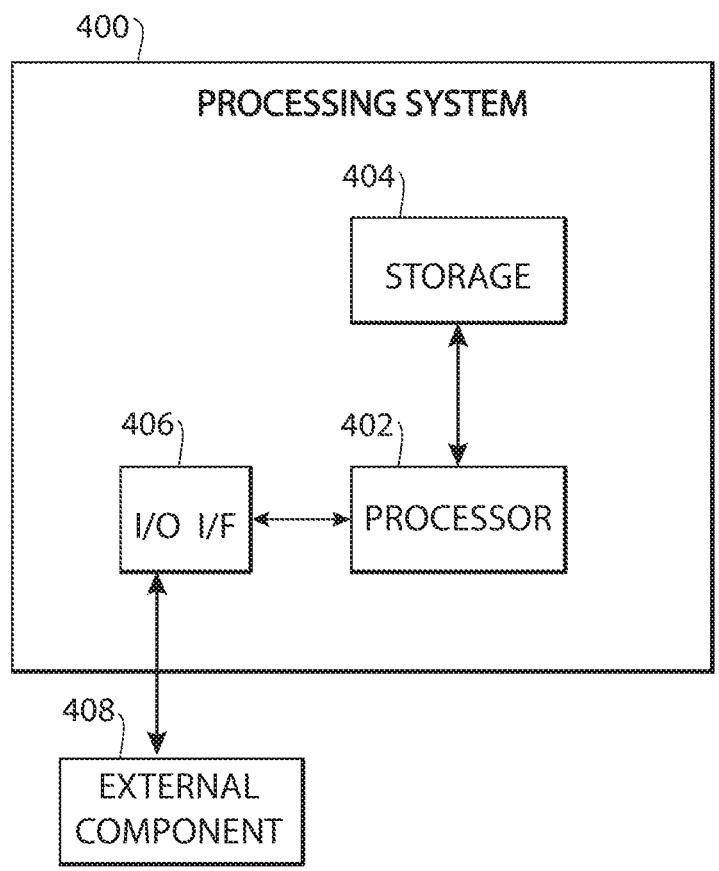
FIG. 4 is a block diagram of an exemplary computer system configured to implement components of the proximity sensor system of FIG. 1.

Monitor device 108 can include a processing device, such as a microprocessor, field programmable gate array (FPGA), application specific integrated circuit (ASIC), etc, that estimates a parameter of the gap, as described in greater detail with respect to FIGS. 2-4.

One or more of sensor 102, measuring equipment 104, and monitor device 108 can be housed in one housing, or can be housed in different housings that are physically remote from one another. At least a portion of components and/or functions of measuring equipment 104 and monitor device 108 can be shared. Functions and/or structures described with respect to either of measuring equipment 104 and monitor device 108 can be ascribed to the other of measuring equipment 104 and monitor device 108.

The monitor system 100 can further include one or more temperature sensors 110 that measure sensor temperature $T_S$ and/or bulk able temperature $T_C$, which can be provided to sensor 102 and/or sensor cable 109 and provided via sensor cable 109 and optionally communication links 111 to measuring equipment 104 and/or monitor device 108. As described further below, the temperature measurements $T_S$ and $T_C$ can be assumed to be substantially equal to one another, since the temperature sensors 110 for measuring $T_S$ and $T_C$ are disposed in essentially the same environment.

In embodiments, temperature measurements $T_S$ and $T_C$ are not measured by a temperature sensor, but are derived from the measured resistance value. As described in greater detail below, this derivation can use a nonlinear model.

Monitor device 108 can determine and output an estimated parameter of gap g, wherein the determination of the estimated gap parameter uses nonlinear models. The estimated gap parameter can be expressed as a binary value that indicates when the estimated gap parameter exceeds a predetermined threshold value. The estimated gap parameter can be provided to a computing device that will generate a notification regarding the estimated gap parameter, such as an alert when the estimated gap parameter exceeds the threshold value and/or an indication that the estimation gap parameter is below the threshold value.

In an example scenario, sensor 102 can be included in an aircraft, such as for sensing appropriate positioning of the target. For example, sensor 102 can be deployed on a surface that is disposed opposite a target, wherein one of the surface and target move between a closed and open position. The closed position can be verified by the estimated gap parameter. In an example application on the aircraft, sensor 102 can be used to verify proper positioning of a door, such as to verify that the door is closed. In another example application on the aircraft, sensor 102 can be used to verify proper positioning of a landing gear, such as to verify that the landing gear is properly positioned, e.g., in a closed position for flight or an open position for landing.

Such doors or landing gear can be extremely heavy, have an arcuate motion path, be subject to vibration, jarring, and turbulence, that can shift positioning and affect alignment between the surface and the target, and/or be subject to positioning variations due to installation of the target or surface and rigging (meaning original placement of the proximity sensor) of the proximity sensor.

One skilled in the art will understand that effective inductance sensed by a proximity sensor, when measured, varies with a parameter of a gap between the proximity sensor and its target, and that measured inductance can be used to estimate the gap. Once skilled in the art will further understand that the inductance measured is influenced by temperature of the proximity sensor and a length of cable between a measuring system for measuring sensed inductance and the proximity sensor. However, when gap parameter estimations are performed using linear relations between cable length, measured sensor inductance, and measured sensor resistance, error is introduced since linearity assumptions hold only for a small range of proximity sensor-to-target gap parameter. Outside of this range, substantial error is introduced into the gap parameter estimate.

Further error can be introduced when resistance associated with the proximity sensor is considered to be constant as a function of the gap parameter. In particular scenarios, for some proximity sensor types, experience has shown that a non-negligible relationship exists between proximity sensor resistance and the gap parameter.

The limited range for which the gap parameter can be accurately estimated using linear assumptions and the introduced error by a failure to account for relationship exists between proximity sensor resistance and the gap parameter can erode confidence in indication of acceptable estimated gap parameter (meaning below the threshold value). Furthermore, such limitations can cause false alarms that erode confidence in alarms and overall gap parameter estimation.

The disclosure describes incorporation of a non-linear model in determining a gap parameter estimation that accounts for the nonlinear relationship between the proximity sensor inductance and the gap parameter, which increases the range of gap parameters for which the gap parameter can be accurately estimated (referred to as a range of accuracy). Additionally, the disclosure describes compensating for the non-negligible relationship between proximity sensor resistance and gap parameter, to avoid introduction of substantial error. The disclosure further describes accounting for influence of sensor temperature and cable length influence on measured inductance and resistance of the proximity sensor.

The increased range of gap parameters that can be accurately estimated and reduction of error by compensating for the non-negligible relationship between proximity sensor resistance and the gap parameter, sensor temperature, and cable length, provide a technological improvement that has not yet been achieved. The increased range of accuracy allows for larger tolerance for variations in positioning of the proximity sensor relative to the target, such as due to rigging variations, shifting due to exposure to vibrations, turbulence, and jarring. The increased range of accuracy and accounting for factors that can introduce error, such as the non-negligible relationship between proximity sensor resistance and gap, sensor temperature, and cable length, provide gap parameter estimation that is robust to noise, provides an improved data curve, promotes confidence in notifications and alerts associated with the estimated gap parameter, and avoids false alarms.

Equations 1 and 2 below provide a measured inductance model (referred to as the $L_S$ model) for estimating corrected inductance that relates the inductance value output by the measuring equipment 104, referred to as measured sensor inductance $L_S$, to parameters, including sensor cable length l, sensor temperature $T_S$, bulk cable temperature $T_C$, and gap parameter g:

$$L_S = L_{cl} + \Delta L_{cT} + L_{s0} + \Delta L_{sT} \quad \text{(Equation 1)}$$

$$L_S = a_1 l + a_2(T_C - T_0)l + \left[a_3 e^{c_1 \frac{1}{g}} + a_{30}\right] + a_4(T_S - T_0), \quad \text{(Equation 2)}$$

where:
$L_{cl} = a_1 l$, contribution of cable length on measured inductance $L_S$;
$\Delta L_{cT} = a_2(T_C - T_0)l$, contribution of cable temperature deviation ($T_C$) from standard ($T_0$) on measured inductance $L_S$;

$$L_{s0} = a_3 e^{c_1 \frac{1}{g}} + a_{30},$$

contribution of sensor-target gap parameter (g), measured at standard temperature ($T_0$), on measured inductance $L_S$; and
$\Delta L_{sT} = a_4(T_S - T_0)$, contribution of sensor temperature deviation ($T_S$) from standard ($T_0$) on measure inductance $L_S$.

Equations 3 and 4 below provide a measured resistance model (referred to as the $R_S$ model) for estimating corrected resistance that relates the resistance value output by the measuring equipment 104, referred to as measured resistance $R_S$, to parameters, including sensor cable length l, sensor temperature $T_S$, bulk cable temperature $T_C$, and gap parameter g:

$$R_S = R_{cl} + \Delta R_{cT} + R_{s0} + \Delta R_{sT} \quad \text{(Equation 3)}$$

$$R_S = b_1 l + b_2(T_C - T_0)l + \left[b_3 e^{c_2 \frac{1}{g}} + b_{30}\right] + b_4(T_S - T_0), \quad \text{(Equation 4)}$$

where:
$R_{cl} = b_1 l$, contribution of cable length on measured resistance $R_S$;
$\Delta R_{cT} = b_2(T_C - T_0)l$, contribution of cable temperature deviation ($T_C$) from standard ($T_0$) on measured resistance $R_S$;

$$R_{s0} = b_3 e^{c_2 \frac{1}{g}} + b_{30},$$

contribution of sensor gap parameter (g), measured at standard temperature ($T_0$), on measured resistance $R_S$; and
$\Delta R_{sT} = b_4(T_S - T_0)$, contribution of sensor temperature deviation ($T_S$) from standard ($T_0$) on measured resistance $R_S$.

The coefficients, $a_1$, $a_2$, $a_3$, $a_{30}$, $c_1$, $a_4$, $b_1$, $b_2$, $b_3$, $b_{30}$, $c_1$, and $b_2$ of the $L_S$ and $R_S$ models in Equations 2 and 4 may be determined experimentally, term by term. For example, one method to determine the coefficient $a_1$ of $L_{cl}$ in Equation 2 involves an experiment where inductance of the cable is measured while systematically varying cable length and holding temperature at $T_0$. An appropriate regression fit can be made that determines $a_1$ when plotting measured inductance against length. The remaining coefficients can be solved experimentally, term by term, in a similar manner of varying the parameter of interest while holding other parameters constant and fitting the resulting data to the term equation. Alternatively, methods such as Design of Experiments, as would be known to one having skill in the art, may be used to vary parameters to determine the coefficients.

Equations 5-8 demonstrate how the $L_S$ and $R_S$ models are manipulated to provide a means of estimating the target gap parameter g, while inherently considering the non-linear relationships of inductance and resistance to gap parameter, correcting for sensor temperature $T_S$, and correcting for sensor cable length l.

As previously stated and shown by Equation 5, method assumes there to be a negligible difference between the bulk cable temperature $T_C$ and sensor temperature $T_S$. This is a reasonable assumption given that the environment of the sensor and its cable, in practice, is the essentially the same in terms of temperature.

$$T_C - T_S \approx 0 \qquad \text{(Equation 5)}$$

Introducing the assumption of Equation 5 regarding bulk cable temperature into the respective $L_S$ and $R_S$ models, Equations 2 and 4, respectively, and re-arranging the equations, Equations 6 and 7 are derived, having a common term of $(T_S-T_0)$, $$(T_S - T_0)(a_2 l + a_4) = L_S - a_1 l - \left[a_3 e^{c_1 \frac{1}{g}} + a_{30}\right] \qquad \text{(Equation 6)}$$

$$(T_S - T_0) = \frac{1}{(a_2 l + a_4)} \left\{ L_S - a_1 l - \left[a_3 e^{c_1 \frac{1}{g}} + a_{30}\right] \right\} \qquad \text{(Equation 7)}$$

Isolating $(T_S-T_0)$, setting the two model equations equal to one another, and rearranging terms gives a non-linear equation with the gap parameter g, isolated, Equations 8 and 9 provide:

$$Kb_3 e^{c_2 \frac{1}{g}} - a_3 e^{c_1 \frac{1}{g}} = \qquad \text{(Equation 8)}$$
$$KR_S - L_S + (a_1 - Kb_1)l - Kb_{30} + a_{30}$$

$$K = \frac{(a_2 l + a_4)}{(b_2 l + b_4)} \qquad \text{(Equation 9)}$$

As noted above, $L_S$ and $R_S$ model coefficients $a_1$, $a_2$, $a_3$, $a_{30}$, $c_1$, $a_4$, $b_1$, $b_2$, $b_3$, $b_{30}$, $c_1$, and $b_2$ can be calculated using experimental data where sensor temperature $T_S$, sensor cable length l, and gap parameter g, can be varied and $L_S$ and $R_S$ are measured and fit against the terms of the $L_S$ and $R_S$ models.

Equations 8 and 9 allow, for a sensor with a known sensor cable length l (and therefore a fixed value of K for that sensor) determination of an estimated gap parameter g.

FIGS. 2 and 3 shows exemplary and non-limiting flow diagrams 200 and 300 illustrating a method for estimating gap parameter between a proximity sensor and a target in accordance with certain illustrated embodiments. The method can be performed by a measuring device and/or a monitor, such as measuring device 104 and monitor 108 shown in FIG. 1. Before turning to description of FIGS. 2 and 3, it is noted that the flow diagrams in FIGS. 2 and 3 show examples in which operational steps are carried out in a particular order, as indicated by the lines connecting the blocks, but the various steps shown in this diagram can be performed in a different order, or in a different combination or sub-combination. It should be appreciated that in some embodiments some of the steps described below may be combined into a single step. In some embodiments, one or more additional steps may be included. In some embodiments, one or more of the steps can be omitted.

Aspects of the present disclosure are described above with reference to block diagrams of methods, apparatus (systems) and computer program products according to embodiments of the disclosure. Features of the methods described include operations, such as equations, transformations, conversions, etc., that can be performed using software, hardware, and/or firmware. Regarding software implementations, it will be understood that individual blocks of the block diagram illustrations and combinations of blocks in the block diagram illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

With reference to FIG. 2, a flow diagram 200 of an example application of a gap parameter estimation calculation method is shown. At operation 210, measured resistance $R_S$ and measured inductance $L_S$ are obtained, e.g., from measuring equipment 104 shown in FIG. 1, and input to a gap parameter calculation method 202, that can be executed by measuring equipment 104 and/or monitor device 108. At operation 212, the coefficients, a1, a2, a3, a30, c1, a4, b1, b2, b3, b30, c1, and b2 of the $L_S$ and $R_S$ models are determined experimentally and provided to the gap parameter calculation method 202. At operation 214, Equation 8 is provided to the calculation method 202. At operation 216, the gap parameter calculation is applied by:

A. Solving the right hand side, referred to as value, of Equation 8, using K, $a_1$, $b_1$, l, $b_{30}$ and $a_{30}$, and the measured resistance $R_S$ and measured inductance $L_S$ from operation 210.

B. Solving for gap parameter g, given right hand side value of Equation 8 using a non-linear solution method. One example for performing the non-linear solution method is to build a pre-defined lookup table that provides values of gap parameter g associated with respective right hand side inputs of value and sensor cable length l. At operation 218, the estimated gap parameter is output.

Once gap parameter g, is estimated, a corrected inductance can be estimated using the appropriate term using the $L_S$ model by applying Equation 10 as follows:

$$L_{s0} = a_3 e^{c_1 \frac{1}{g}} + a_{30} \qquad \text{(Equation 10)}$$

With reference to FIG. 3, a flow diagram 300 of an example application of a corrected inductance calculation method is shown. At operation 310, estimated gap parameter as output by flow diagram 200 of FIG. 2 is obtained. At operation 312, the coefficients, a1, a2, a3, a30, c1, a4, b1, b2, b3, b30, c1, and b2 of the $L_S$ and $R_S$ models are determined experimentally and provided to the corrected inductance calculation method 302. At operation 314, Equation 10 is provided to the corrected inductance calculation method 302. At operation 316 the corrected inductance relation is applied by the corrected inductance calculation method 302. At operation 318, the estimated corrected inductance is output.

With reference to FIG. 4, a block diagram of an example computing system 400 is shown, which provides an example configuration of the measuring equipment 104 and/or monitor device 108 or one or more portions of the measuring equipment 104 and/or monitor device 108. Additionally, all or portions of the measuring equipment 104 and/or monitor device 108 could be configured as software, and computing system 400 could represent such portions. Computing system 400 is only one example of a suitable system and is not intended to suggest any limitation as to the scope of use or functionality of embodiments of the disclosure described herein. Computing system 400 can be implemented using hardware, software, and/or firmware. Regardless, computing system 400 is capable of being implemented and/or performing functionality as set forth in the disclosure.

Computing system 400 is shown in the form of a general-purpose computing device. Computing system 400 includes a processing device 402, memory 404, an input/output (I/O) interface (I/F) 406 that can communicate with an internal component 410, and optionally an external component 408.

The processing device 402 can include, for example, a PLOD, microprocessor, DSP, a microcontroller, an FPGA, an ASCI, and/or other discrete or integrated logic circuitry having similar processing capabilities.

The processing device 402 and the memory 404 can be included in components provided in the FPGA, ASCI, microcontroller, or microprocessor, for example. Memory 404 can include, for example, volatile and non-volatile memory for storing data temporarily or long term, and for storing programmable instructions executable by the processing device 402. I/O I/F 406 can include an interface and/or conductors to couple to the one or more internal components 408 and/or external components 410.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow diagram and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the block diagram block or blocks.

Embodiments of the measuring equipment 104 and/or monitor device 108 may be implemented or executed by one or more computer systems, such as a microprocessor. Each computer system 400 can implement measuring equipment 104 and/or monitor device 108, or multiple instances thereof. In various embodiments, computer system 400 may include one or more of a microprocessor, an FPGA, application specific integrated circuit (ASCI), microcontroller. The computer system 400 can be provided as an embedded device. Portions of the computer system 400 can be provided externally, such by way of a centralized computer, a data concentrator, a cockpit computing device controls display of gap status, e.g., notifications about the gap or alerts, or the like.

Computer system 400 is only one example of a suitable system and is not intended to suggest any limitation as to the scope of use or functionality of embodiments of the disclosure described herein. Regardless, computer system 400 is capable of being implemented and/or performing any of the functionality set forth hereinabove.

Computer system 400 may be described in the general context of computer system-executable instructions, such as program modules, being executed by a computer system, Generally, program modules may include routines, programs, objects, components, logic, data structures, and so on that perform particular tasks or implement particular abstract data types.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the illustrated embodiments, exemplary methods and materials are now described. All publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

While the apparatus and methods of the subject disclosure have been shown and described with reference to embodiments, those skilled in the art will readily appreciate that changes and/or modifications may be made thereto without departing from the spirit and scope of the subject disclosure.

The invention claimed is:

1. A system for sensing proximity of a target, the system comprising:
 a sensor configured to generate a magnetic field and sense inductance and resistance, wherein the inductance is affected by the target when the target is proximate the sensor;
 a sensor cable coupled to the sensor, the sensor cable being configured to provide the sensed inductance from the sensor to processing equipment; and
 the processing equipment configured to receive the sensed inductance and resistance via the sensor cable, determine an inductance value from the sensed inductance as a function of an inductance model, and a resistance value from the sensed resistance as a function of a resistance model, and estimate a parameter of a gap between the sensor and the target by a lookup step as a function of the inductance value, the resistance value, the inductance model, and the resistance model, wherein the inductance model includes a first term giving a non-linear relationship between the parameter and inductance and applies experimentally determined first coefficients, and the resistance model includes a second term giving a non-linear relationship between the parameter and resistance and applies experimentally determined second coefficients.

2. The system of claim 1, wherein the processing equipment is further configured to use the resistance value to correct for variation in sensor temperature when estimating the parameter.

3. The system of claim 2, wherein the processing equipment is further configured to use models of influence of cable length of the sensor cable on the inductance and resistance of the sensor to determine corrections for cable length variation.

4. The system of claim 3, wherein the processing equipment is further configured to correct the inductance and resistance values for at least one of temperature and the cable length variation.

5. The system of claim 4, wherein the processing equipment is further configured to estimate the parameter by using the corrected inductance and resistance values.

6. The system of claim 1, wherein the processing equipment is further configured to estimate the parameter by— outputting a binary indication whether the parameter is acceptable or unacceptable.

7. A method for sensing proximity of a target, the method comprising:
sensing inductance and resistance associated with a magnetic field, wherein the inductance is affected by the target when the target is proximate the magnetic field; and
providing the sensed inductance for processing, wherein the processing comprises:
determining an inductance value from the sensed inductance as a function of an inductance model;
determining a resistance value from the sensed resistance as a function of a resistance model;
performing a lookup step as a function of the inductance value, the resistance value, the inductance model, and the resistance model; and
estimating a parameter of a gap between a location of sensing the inductance and the target by a result of the lookup step,
wherein the inductance model includes a first term giving a non-linear relationship between the parameter and inductance and applies experimentally determined first coefficients, and the resistance model includes a second term giving a non-linear relationship between the parameter and resistance and applies experimentally determined second coefficients.

8. The method of claim 7, further comprising using the resistance value to correct for variation in temperature near the sensing when estimating the parameter.

9. The method of claim 8, further comprising using models of influence of cable length on the sensed inductance and resistance to determine corrections for cable length variation, wherein cable length is a length of a cable that provides the sensed resistance and inductance for processing.

10. The method of claim 9, further comprising correcting the inductance and resistance values for at least one of temperature and the cable length variation.

11. The method of claim 10, wherein estimating the parameter further includes using the corrected inductance and resistance values.

12. The method of claim 7, wherein estimating the parameter further includes outputting a binary indication whether the parameter is acceptable or unacceptable.

13. A method for sensing proximity of a target, the method comprising:
receiving a signal associated with sensing inductance and resistance associated with a magnetic field, wherein the inductance is affected by the target when the target is proximate the magnetic field;
determining an inductance value from the signal as a function of an inductance model;
determining a resistance value from the signal as a function of a resistance model;
performing a lookup step as a function of the inductance value, the resistance value, the inductance model, and the resistance model; and
estimating a parameter of a gap between a location of sensing the inductance and the target by a result of the lookup step,
wherein the inductance model includes a first term giving a non-linear relationship between the parameter and inductance and applies experimentally determined first coefficients, and the resistance model includes a second term giving a non-linear relationship between the parameter and resistance and applies experimentally determined second coefficients.

14. The method of claim 13, further comprising using the resistance value to correct for variation in temperature near the sensing when estimating the parameter.

15. The method of claim 14, further comprising using models of influence of cable length on the sensed inductance and resistance to determine corrections for cable length variation, wherein cable length is a length of a cable that provides the sensed resistance and inductance for processing.

16. The method of claim 15, further comprising: correcting the inductance and resistance values for at least one of temperature and the cable length variation; and
estimating the parameter further includes using the corrected inductance and resistance values.

17. The method of claim 13, wherein estimating the parameter includes outputting a binary indication whether the parameter is acceptable or unacceptable.

* * * * *